(12) United States Patent
Xie et al.

(10) Patent No.: US 10,566,438 B2
(45) Date of Patent: Feb. 18, 2020

(54) NANOSHEET TRANSISTOR WITH DUAL INNER AIRGAP SPACERS

(71) Applicant: International Business Machines Corporation, Armonk, NY (US)

(72) Inventors: Ruilong Xie, Schenectady, NY (US); Kangguo Cheng, Schenectady, NY (US); Chun-Chen Yeh, Danbury, NY (US); Tenko Yamashita, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 24 days.

(21) Appl. No.: 15/942,971

(22) Filed: Apr. 2, 2018

(65) Prior Publication Data

US 2019/0305104 A1 Oct. 3, 2019

(51) Int. Cl.
| | | |
|---|---|---|
| *H01L 29/49* | (2006.01) | |
| *H01L 29/06* | (2006.01) | |
| *H01L 29/423* | (2006.01) | |
| *H01L 27/092* | (2006.01) | |
| *H01L 29/66* | (2006.01) | |

(Continued)

(52) U.S. Cl.
CPC .... *H01L 29/4991* (2013.01); *H01L 21/02532* (2013.01); *H01L 21/02603* (2013.01); *H01L 21/308* (2013.01); *H01L 21/30604* (2013.01); *H01L 21/823807* (2013.01); *H01L 21/823864* (2013.01); *H01L 21/823878* (2013.01); *H01L 27/092* (2013.01); *H01L 29/0649* (2013.01); *H01L 29/0673* (2013.01); *H01L 29/42392* (2013.01); *H01L 29/4908* (2013.01); *H01L 29/66545* (2013.01); *H01L 29/66553* (2013.01); *H01L 29/66742* (2013.01); *H01L 29/78651* (2013.01); *H01L 29/78696* (2013.01)

(58) Field of Classification Search
CPC ............... H01L 27/092; H01L 29/0649; H01L 29/0673; H01L 29/4991; H01L 29/42392
USPC ................................ 257/351, 369, 392, 405
See application file for complete search history.

(56) References Cited

U.S. PATENT DOCUMENTS 8,778,768 B1 7/2014 Chang et al.
9,287,357 B2 5/2016 Rodder et al.
(Continued)

OTHER PUBLICATIONS

Loubet et al., "Stacked nanosheet gate-all-around transistor to enable scaling beyond FinFET," Symposium on VLSI Technology, 2017, pp. T230-T231.

*Primary Examiner* — Matthew E Warren
(74) *Attorney, Agent, or Firm* — Garg Law Firm, PLLC; Rakesh Garg; Joseph Petrokaitis

(57) ABSTRACT

A substrate structure includes a set of nanosheet layers stacked upon a substrate. The substrate structure includes a p-channel region and an n-channel region. The substrate structure further includes divots within the p-channel region and the n-channel region. A first liner is formed within the divots of the n-channel region. The first liner is formed of a material having a positive charge. A second liner is formed within the divots of the p-channel region. The second liner is formed of a material having a negative charge. A p-type epitaxy is deposited in the p-channel region to form first air gap spacers of the divots in the p-channel region. An n-type epitaxy is deposited in the n-channel region to form second air gap spacers of the divots in the n-channel region.

5 Claims, 16 Drawing Sheets

(51) Int. Cl.
*H01L 29/786* (2006.01)
*H01L 21/02* (2006.01)
*H01L 21/8238* (2006.01)
*H01L 21/306* (2006.01)
*H01L 21/308* (2006.01)

(56) References Cited

U.S. PATENT DOCUMENTS

| | | |
|---|---|---|
| 9,362,355 B1 | 6/2016 | Cheng et al. |
| 9,647,139 B2 | 5/2017 | Doris et al. |
| 9,716,158 B1 | 7/2017 | Cheng et al. |
| 10,361,202 B2 * | 7/2019 | Suh .................. H01L 29/66545 |
| 2014/0326952 A1 | 11/2014 | Kuhn et al. |
| 2015/0295084 A1 | 10/2015 | Obradovic et al. |
| 2016/0071729 A1 | 3/2016 | Hatcher et al. |
| 2017/0110554 A1 * | 4/2017 | Tak ..................... H01L 29/4991 |
| 2017/0309719 A1 | 10/2017 | Sun et al. |
| 2019/0157414 A1 * | 5/2019 | Ando .................. H01L 29/4991 |
| 2019/0279913 A1 * | 9/2019 | Gluschenkov ............................. H01L 21/823814 |

* cited by examiner

NANOSHEET TRANSISTOR WITH DUAL INNER AIRGAP SPACERS

TECHNICAL FIELD

The present invention relates generally to a method, system, and computer program product for fabricating nanosheet transistors. More particularly, the present invention relates to a method, system, and computer program product for fabricating nanosheet transistors with dual inner airgap spacers.

BACKGROUND

An integrated circuit (IC) is an electronic circuit formed using a semiconductor material, such as Silicon, as a substrate and by adding impurities to form solid-state electronic devices, such as transistors, diodes, capacitors, and resistors. Commonly known as a "chip" or a "package", an integrated circuit is generally encased in hard plastic, forming a "package". The components in modern day electronics generally appear to be rectangular black plastic packages with connector pins protruding from the plastic encasement. Often, many such packages are electrically coupled so that the chips therein form an electronic circuit to perform certain functions.

The software tools used for designing ICs produce, manipulate, or otherwise work with the circuit layout and circuit components on very small scales. Some of the components that such a tool may manipulate may only measure tens of nanometer across when formed in Silicon. The designs produced and manipulated using these software tools are complex, often including hundreds of thousands of such components interconnected to form an intended electronic circuitry.

A layout includes shapes that the designer selects and positions to achieve a design objective. The objective is to have the shape—the target shape—appear on the wafer as designed. However, the shapes may not appear exactly as designed when manufactured on the wafer through photolithography. For example, a rectangular shape with sharp corners may appear as a rectangular shape with rounded corners on the wafer.

Once a design layout, also referred to simply as a layout, has been finalized for an IC, the design is converted into a set of masks or reticles. A set of masks or reticles is one or more masks or reticles. During manufacture, a semiconductor wafer is exposed to light or radiation through a mask to form microscopic components of the IC. This process is known as photolithography.

A manufacturing mask is a mask usable for successfully manufacturing or printing the contents of the mask onto wafer. During the photolithographic printing process, radiation is focused through the mask and at certain desired intensity of the radiation. This intensity of the radiation is commonly referred to as "dose". The focus and the dosing of the radiation has to be precisely controlled to achieve the desired shape and electrical characteristics on the wafer.

The software tools used for designing ICs produce, manipulate, or otherwise work with the circuit layout and circuit components on very small scales. Some of the components that such a tool may manipulate may only measure tens of nanometer across when formed in Silicon. The designs produced and manipulated using these software tools are complex, often including hundreds of thousands of such components interconnected to form an intended electronic circuitry.

Many semiconductor devices are planar, i.e., where the semiconductor structures are fabricated on one plane. A non-planar device is a three-dimensional (3D) device where some of the structures are formed above or below a given plane of fabrication.

A Field Effect Transistor (FET) is a semiconductor device that has controls the electrical conductivity between a source of electric current (source) and a destination of the electrical current (drain). The FET uses a semiconductor structure called a "gate" to create an electric field, which controls the shape and consequently the electrical conductivity of a channel between the source and the drain. The channel is a charge carrier pathway constructed using a semiconductor material.

Nanosheet transistor devices are becoming increasingly pursed as a viable semiconductor device option, especially for transistors at smaller scales, e.g., at five nanometer (nm) and smaller scales. A nanosheet FET transistor typically includes a substrate, an isolation layer, a number of vertically stacked nanosheets forming a channel, and a gate. A nanosheet is formed of a thin layer of semiconductor channel material having a vertical thickness that is less than a width of the material.

SUMMARY

The illustrative embodiments provide a method, system, and computer program product. An embodiment of a method of fabricating a nanosheet transistor comprising includes receiving a substrate structure having a set of nanosheet layers and a set of sacrificial layers stacked upon a substrate. In the embodiment, the substrate structure includes a p-channel region and an n-channel region. The embodiment further includes etching a portion of the set of sacrificial layers to form divots within the p-channel region and the n-channel region of the set of sacrificial layers. The embodiment further includes forming a first liner on the p-channel region and the re-channel region. In the embodiment, the first liner is formed of a material having a positive charge. The embodiment further includes removing the first liner from the p-channel region, and forming a second liner on the p-channel region and n-channel region. In the embodiment, the second liner is formed of a material having a negative charge. The embodiment further includes selectively removing the second liner from portions of the p-channel region and n-channel region, wherein portions of the second liner within the divots substantially remain. The embodiment further includes depositing a p-type epitaxy in the p-channel region to form first air gap spacers of the divots in the p-channel region. The embodiment further includes selectively removing the first liner from the re-channel region, wherein portions of the first liner within the divots of the n-channel region substantially remain. The embodiment further includes depositing an n-type epitaxy in the n-channel region to form second air gap spacers of the divots in the n-channel region.

An embodiment further includes forming a first dummy gate upon the p-channel region and a second dummy gate upon the n-channel region of the stacked set of nanosheet layers and the set of sacrificial layers.

An embodiment further includes etching a portion of the set of sacrificial layers and the set of nanosheet layers adjacent to each of the first dummy gate and the second dummy gate.

An embodiment further includes applying a mask to the n-channel region prior to removing the first liner from the p-channel region. An embodiment further includes removing the mask from the n-channel region after removing the first liner from the p-channel region. An embodiment further includes forming a first hard mask over the first dummy gate, and forming a second hard mask over the second dummy gate.

In an embodiment, the set of sacrificial layers and the set of nanosheet layers are etched to be substantially aligned to one or more sides of the first hard mask and the second hard mask.

In an embodiment, the set of nanosheet layers and the set of sacrificial layers are stacked upon an isolation layer, and wherein the isolation layer is disposed upon the substrate.

An embodiment further includes removing the first dummy gate and the second dummy gate, removing the set of sacrificial layers, and depositing a gate material within one or more voids formed due to removal of the first dummy gate, the second dummy date, and the set of sacrificial layers. An embodiment further includes forming metal contacts to the gate material.

In an embodiment, the set of nanosheet layers are formed of silicon (Si) material. In an embodiment, the set of sacrificial layers are formed of a silicon-germanium (SiGe) material.

An embodiment of an apparatus includes a substrate structure having a set of nanosheet layers stacked upon a substrate. In the embodiment, the substrate structure includes a p-channel region and an n-channel region. In the embodiment, the substrate structure further includes divots within the p-channel region and the re-channel region. The embodiment further includes a first liner formed within the divots of the n-channel region. In the embodiment, the first liner is formed of a material having a positive charge. The embodiment further includes a second liner formed within the divots of the p-channel region. In the embodiment, the second liner is formed of a material having a negative charge. The embodiment further Includes a p-type epitaxy deposited in the p-channel region to form first air gap spacers of the divots in the p-channel region. The embodiment further includes an n-type epitaxy deposited in the n-channel region to form second air gap spacers of the divots in the n-channel region.

An embodiment further includes an isolation layer disposed upon the substrate, wherein the set of nanosheet layers are stacked upon the isolation layer.

An embodiment further includes a first gate material adjacent to the first air gap spacers of p-channel region, and a second gate material adjacent to the second air gap spacers of the n-channel region. An embodiment further includes at least one metal contact in contact with the first gate material. In an embodiment, the set of nanosheet layers are formed of silicon (Si) material.

An embodiment includes a computer usable program product. The computer usable program product includes one or more computer-readable storage devices, and program instructions stored on at least one of the one or more storage devices.

In an embodiment, the computer usable code is stored in a computer readable storage device in a data processing system, and wherein the computer usable code is transferred over a network from a remote data processing system.

In an embodiment, the computer usable code is stored in a computer readable storage device in a server data processing system, and wherein the computer usable code is downloaded over a network to a remote data processing system for use in a computer readable storage device associated with the remote data processing system.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

Figure 1:
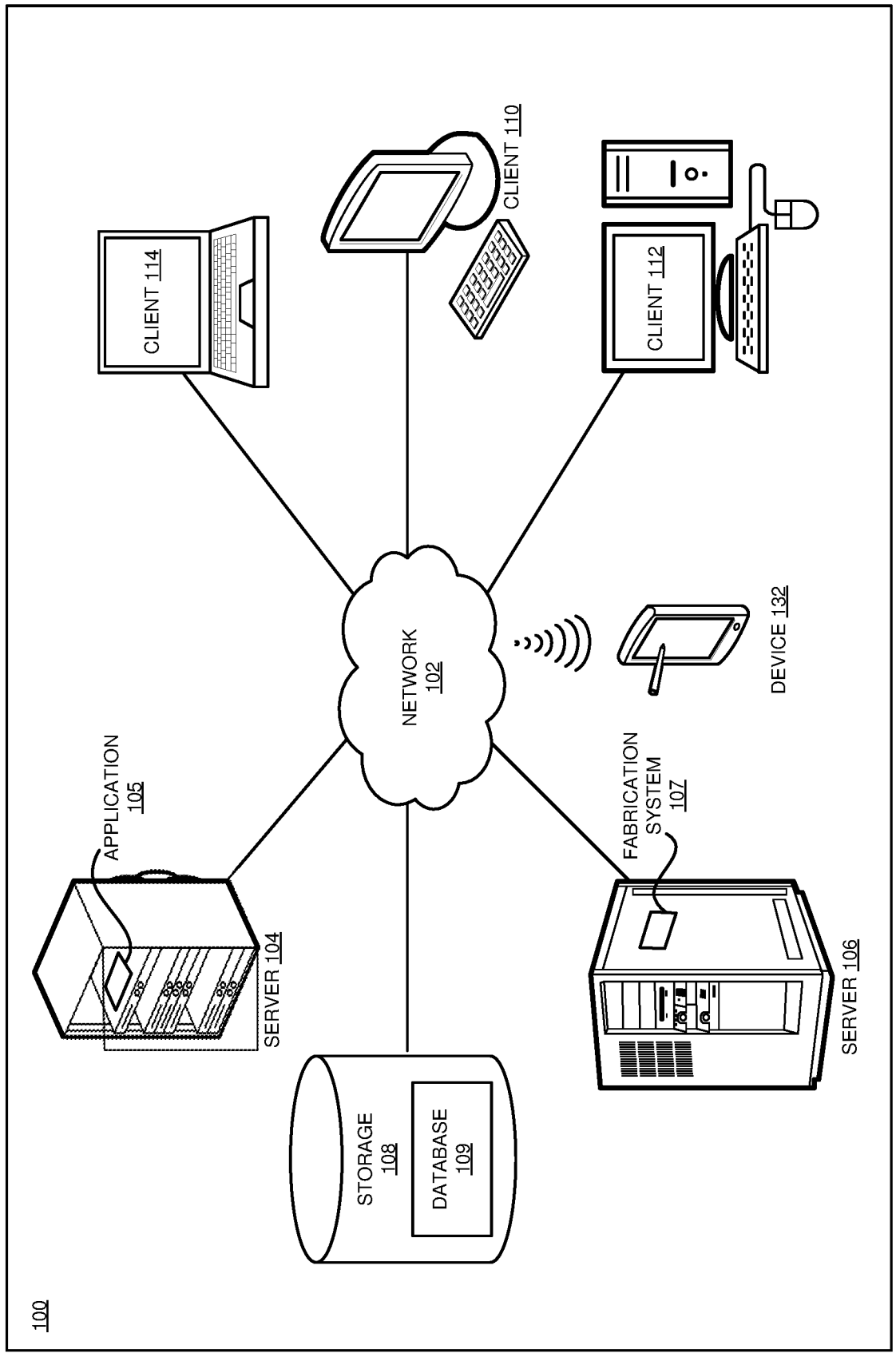
FIG. 1 depicts a block diagram of a network of data processing systems in which illustrative embodiments may be implemented.

The illustrative embodiments relate to a method, system, and computer program product for nanosheet transistors with dual inner airgap spacers. The illustrative embodiments recognize that the present methods and techniques for fabricating nanosheet transistors suffer from several problems. For example, forming inner airgap spacers, particularly those requiring tight design ground rules, is challenging. Nanosheet transistors, like other metal-oxide-semiconductor field-effect transistors (MOSFETs), will benefit if the resulting transistor has low extension resistance and low parasitic capacitance characteristics. The unique stacked nanosheet structure poses challenges in forming sharp junctions to reduce extension resistance. Certain embodiments used to describe the invention generally address and solve one or more of the above-described problems and other problems related to fabricating nanosheet transistors.

Various embodiments provided for forming different inner spacers for n-channel field-effect transistor (NFET) and p-channel field-effect transistor (PFET) regions of nanosheet transistors to reduce extension resistance. In one or more embodiments, NFET inner spacers are formed of a material (e.g., silicon nitride) having positive fixed charges, and PFET inner spacers are formed of a material (e.g., aluminum oxide) having negative fixed charges. In one or more embodiments, the positive charge of the NFET inner spacers reduces NFET extension resistance, and the negative charge of the PFET inner spacers reduces PFET extension resistances. Further, in one or more embodiments air gap spacers in both the NFET and PFET regions are fabricated to reduce parasitic capacitance of the nanosheet transistors. One or more embodiments provide for a nanosheet transistor having different inner spacer structure for the NFET and PFET regions as well as air gaps in the inner spacers. One or more embodiments provide for a process flow to enable different inner spacer structures and epitaxy to be fabricated for NFET and PFET regions of a nanosheet transistor.

An embodiment can be implemented as a software application. The application implementing an embodiment can be configured as a modification of an existing fabrication system, as a separate application that operates in conjunction with an existing fabrication system, a standalone application, or some combination thereof. For example, the application causes the fabrication system to perform the steps described herein, to fabricate nanosheet transistors.

For the clarity of the description, and without implying any limitation thereto, the illustrative embodiments are described using n-type FET (NFET) nanosheet transistors and p-type FET (PFET) nanosheet transistors disposed on a substrate. An embodiment can be implemented with different types and/or numbers of nanosheet transistors, a different number of gates, and/or a different number of substrates within the scope of the illustrative embodiments.

Furthermore, a simplified diagram of the example NFETs and PFETs are used in the figures and the illustrative embodiments. In an actual fabrication of a NFET and PFET, additional structures that are not shown or described herein may be present without departing the scope of the illustrative embodiments. Similarly, within the scope of the illustrative embodiments, a shown or described structure in the example NFETs and PFETs may be fabricated differently to yield a similar operation or result as described herein.

Differently shaded portions in the two-dimensional drawing of the example NFETs and PFETs are intended to represent different structures in the example NFETs and PFETs, as described herein. The different structures may be fabricated using suitable materials that are known to those of ordinary skill in the art.

A specific shape or dimension of a shape depicted herein is not intended to be limiting on the illustrative embodiments. The shapes and dimensions are chosen only for the clarity of the drawings and the description and may have been exaggerated, minimized, or otherwise changed from actual shapes and dimensions that might be used in actually fabricating nanosheet NFETs and PFETs according to the illustrative embodiments.

Furthermore, the illustrative embodiments are described with respect to nanosheet NFETs and PFETs only as an example. The steps described by the various illustrative embodiments can be adapted for fabricating other planar and non-planar devices employing nanosheets in a similar manner, and such adaptations are contemplated within the scope of the illustrative embodiments.

An embodiment when implemented in an application causes a fabrication process to performs certain steps as described herein. The steps of the fabrication process are depicted in the several figures. Not all steps may be necessary in a particular fabrication process. Some fabrication processes may implement the steps in different order, combine certain steps, remove or replace certain steps, or perform some combination of these and other manipulations of steps, without departing the scope of the illustrative embodiments.

A method of an embodiment described herein, when implemented to execute on a device or data processing system, comprises substantial advancement of the functionality of that device or data processing system in fabricating nanosheet transistor devices. An embodiment provides a method for fabricating nanosheet transistors with dual inner airgap spacers.

The illustrative embodiments are described with respect to certain types of devices, contacts, layers, planes, structures, materials, dimensions, numerosity, data processing systems, environments, components, and applications only as examples. Any specific manifestations of these and other similar artifacts are not intended to be limiting to the invention. Any suitable manifestation of these and other similar artifacts can be selected within the scope of the illustrative embodiments.

Furthermore, the illustrative embodiments may be implemented with respect to any type of data, data source, or access to a data source over a data network. Any type of data storage device may provide the data to an embodiment of the invention, either locally at a data processing system or over a data network, within the scope of the invention. Where an embodiment is described using a mobile device, any type of data storage device suitable for use with the mobile device may provide the data to such embodiment, either locally at the mobile device or over a data network, within the scope of the illustrative embodiments.

The illustrative embodiments are described using specific code, designs, architectures, protocols, layouts, schematics, and tools only as examples and are not limiting to the illustrative embodiments. Furthermore, the illustrative embodiments are described in some instances using particular software, tools, and data processing environments only as an example for the clarity of the description. The illustrative embodiments may be used in conjunction with other comparable or similarly purposed structures, systems, applications, or architectures. For example, other comparable mobile devices, structures, systems, applications, or architectures therefor, may be used in conjunction with such embodiment of the invention within the scope of the invention. An illustrative embodiment may be implemented in hardware, software, or a combination thereof.

The examples in this disclosure are used only for the clarity of the description and are not limiting to the illustrative embodiments. Additional data, operations, actions, tasks, activities, and manipulations will be conceivable from this disclosure and the same are contemplated within the scope of the illustrative embodiments.

Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

Figure 2:
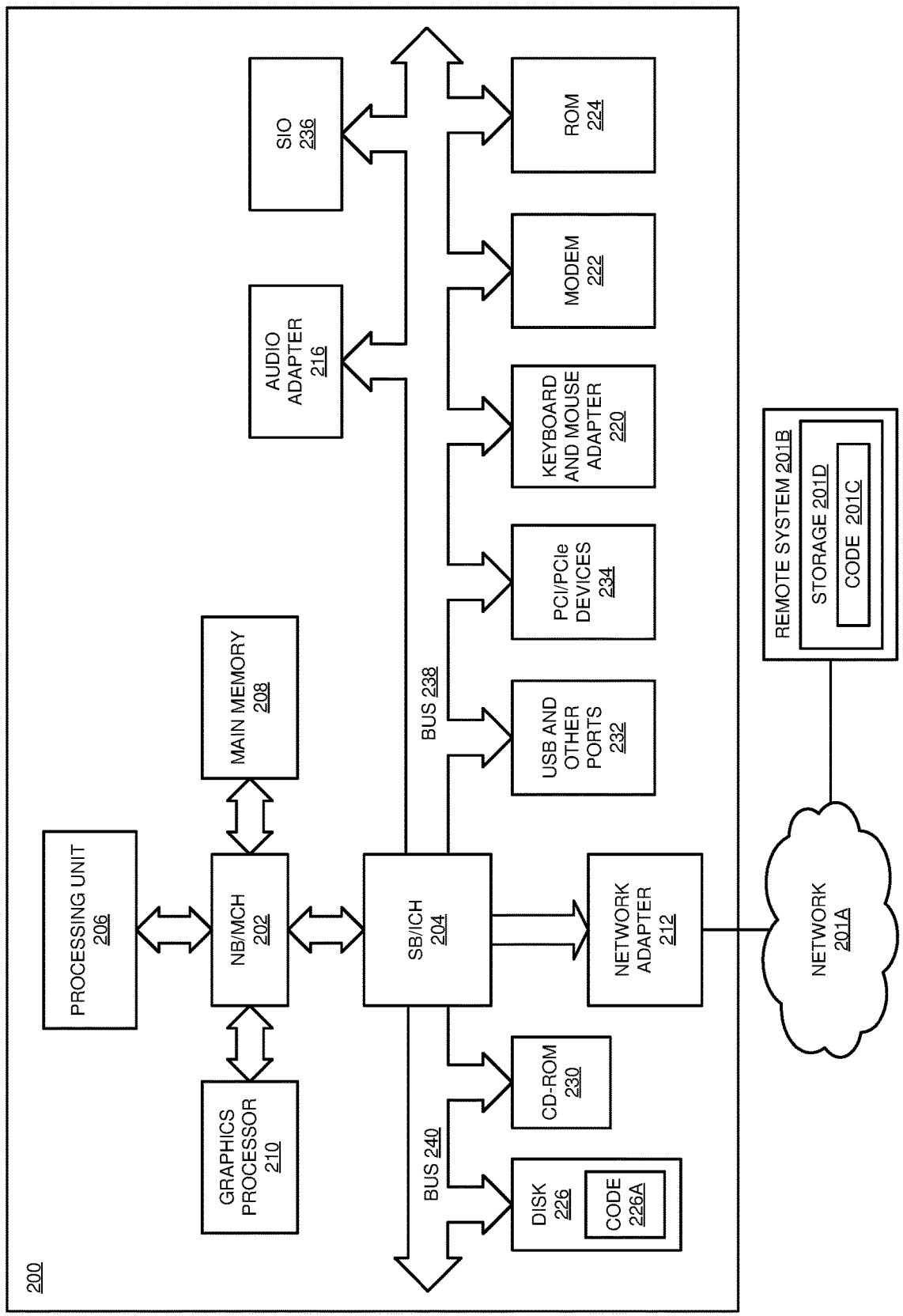
FIG. 2 depicts a block diagram of a data processing system in which illustrative embodiments may be implemented.

With reference to the figures and in particular with reference to FIGS. 1 and 2, these figures are example diagrams of data processing environments in which illustrative embodiments may be implemented. FIGS. 1 and 2 are only examples and are not intended to assert or imply any limitation with regard to the environments in which different embodiments may be implemented. A particular implementation may make many modifications to the depicted environments based on the following description.

FIG. 1 depicts a block diagram of a network of data processing systems in which illustrative embodiments may be implemented. Data processing environment 100 is a network of computers in which the illustrative embodiments may be implemented. Data processing environment 100 includes network 102. Network 102 is the medium used to provide communications links between various devices and computers connected together within data processing environment 100. Network 102 may include connections, such as wire, wireless communication links, or fiber optic cables.

Clients or servers are only example roles of certain data processing systems connected to network 102 and are not intended to exclude other configurations or roles for these data processing systems. Server 104 and server 106 couple to network 102 along with storage unit 108. Software applications may execute on any computer in data processing environment 100. Clients 110, 112, and 114 are also coupled to network 102. A data processing system, such as server 104 or 106, or client 110, 112, or 114 may contain data and may have software applications or software tools executing thereon.

Only as an example, and without implying any limitation to such architecture, FIG. 1 depicts certain components that are usable in an example implementation of an embodiment. For example, servers 104 and 106, and clients 110, 112, 114, are depicted as servers and clients only as example and not to imply a limitation to a client-server architecture. As another example, an embodiment can be distributed across several data processing systems and a data network as shown, whereas another embodiment can be Implemented on a single data processing system within the scope of the illustrative embodiments. Data processing systems 104, 106, 110, 112, and 114 also represent example nodes in a cluster, partitions, and other configurations suitable for implementing an embodiment.

Device 132 is an example of a device described herein. For example, device 132 can take the form of a smartphone, a tablet computer, a laptop computer, client 110 in a stationary or a portable form, a wearable computing device, or any other suitable device. Any software application described as executing in another data processing system in FIG. 1 can be configured to execute in device 132 in a similar manner. Any data or information stored or produced in another data processing system in FIG. 1 can be configured to be stored or produced in device 132 in a similar manner.

Application 105 implements an embodiment described herein. Fabrication system 107 is any suitable system for fabricating a semiconductor device. Application 105 provides instructions to system 107 for fabricating one or more nanosheet transistors in a manner described herein.

Servers 104 and 106, storage unit 108, and clients 110, 112, and 114 may couple to network 102 using wired connections, wireless communication protocols, or other suitable data connectivity. Clients 110, 112, and 114 may be, for example, personal computers or network computers.

In the depicted example, server 104 may provide data, such as boot files, operating system images, and applications to clients 110, 112, and 114. Clients 110, 112, and 114 may be clients to server 104 in this example. Clients 110, 112, 114, or some combination thereof, may include their own data, boot files, operating system images, and applications. Data processing environment 100 may include additional servers, clients, and other devices that are not shown.

In the depicted example, data processing environment 100 may be the Internet. Network 102 may represent a collection of networks and gateways that use the Transmission Control Protocol/Internet Protocol (TCP/IP) and other protocols to communicate with one another. At the heart of the Internet is a backbone of data communication links between major nodes or host computers, including thousands of commercial, governmental, educational, and other computer systems that route data and messages. Of course, data processing environment 100 also may be implemented as a number of different types of networks, such as for example, an intranet, a local area network (LAN), or a wide area network (WAN). FIG. 1 is intended as an example, and not as an architectural limitation for the different illustrative embodiments.

Among other uses, data processing environment 100 may be used for implementing a client-server environment in which the illustrative embodiments may be implemented. A client-server environment enables software applications and data to be distributed across a network such that an application functions by using the interactivity between a client data processing system and a server data processing system. Data processing environment 100 may also employ a service-oriented architecture where interoperable software components distributed across a network may be packaged together as coherent business applications.

With reference to FIG. 2, this figure depicts a block diagram of a data processing system in which illustrative embodiments may be implemented. Data processing system 200 is an example of a computer, such as servers 104 and 106, or clients 110, 112, and 114 in FIG. 1, or another type of device in which computer usable program code or instructions implementing the processes may be located for the illustrative embodiments.

Data processing system 200 is also representative of a data processing system or a configuration therein, such as data processing system 132 in FIG. 1 in which computer usable program code or instructions implementing the processes of the illustrative embodiments may be located. Data processing system 200 is described as a computer only as an example, without being limited thereto. Implementations in the form of other devices, such as device 132 in FIG. 1, may modify data processing system 200, such as by adding a touch interface, and even eliminate certain depicted components from data processing system 200 without departing from the general description of the operations and functions of data processing system 200 described herein.

In the depicted example, data processing system 200 employs a hub architecture including North Bridge and memory controller hub (NB/MCH) 202 and South Bridge and input/output (I/O) controller hub (SB/ICH) 204. Processing unit 206, main memory 208, and graphics processor 210 are coupled to North Bridge and memory controller hub (NB/MCH) 202. Processing unit 206 may contain one or more processors and may be implemented using one or more heterogeneous processor systems. Processing unit 206 may be a multi-core processor. Graphics processor 210 may be coupled to NB/MCH 202 through an accelerated graphics port (AGP) in certain implementations.

In the depicted example, local area network (LAN) adapter 212 is coupled to South Bridge and I/O controller hub (SB/ICH) 204. Audio adapter 216, keyboard and mouse adapter 220, modem 222, read only memory (ROM) 224, universal serial bus (USB) and other ports 232, and PCI/PCIe devices 234 are coupled to South Bridge and I/O controller hub 204 through bus 238. Hard disk drive (HDD) or solid-state drive (SSD) 226 and CD-ROM 230 are coupled to South Bridge and I/O controller hub 204 through bus 240. PCI/PCIe devices 234 may include, for example, Ethernet adapters, add-in cards, and PC cards for notebook computers. PCI uses a card bus controller, while PCIe does not. ROM 224 may be, for example, a flash binary input/output system (BIOS). Hard disk drive 226 and CD-ROM 230 may use, for example, an integrated drive electronics (IDE), serial advanced technology attachment (SATA) interface, or variants such as external-SATA (eSATA) and micro-SATA (mSATA). A super I/O (SIO) device 236 may be coupled to South Bridge and I/O controller hub (SB/ICH) 204 through bus 238.

Memories, such as main memory 208, ROM 224, or flash memory (not shown), are some examples of computer usable storage devices. Hard disk drive or solid state drive 226, CD-ROM 230, and other similarly usable devices are some examples of computer usable storage devices including a computer usable storage medium.

An operating system runs on processing unit 206. The operating system coordinates and provides control of various components within data processing system 200 in FIG. 2. The operating system may be a commercially available operating system such as AIX® (AIX is a trademark of International Business Machines Corporation in the United States and other countries), Microsoft® Windows® (Microsoft and Windows are trademarks of Microsoft Corporation in the United States and other countries), Linux® (Linux is a trademark of Linus Torvalds in the United States and other countries), iOS™ (iOS is a trademark of Cisco Systems, Inc. licensed to Apple Inc. in the United States and in other countries), or Android™ (Android is a trademark of Google Inc., in the United States and in other countries). An object oriented programming system, such as the Java™ programming system, may run in conjunction with the operating system and provide calls to the operating system from Java™ programs or applications executing on data processing system 200 (Java and all Java-based trademarks and logos are trademarks or registered trademarks of Oracle Corporation and/or its affiliates).

Instructions for the operating system, the object-oriented programming system, and applications or programs, such as application 105 in FIG. 1, are located on storage devices, such as in the form of code 226A on hard disk drive 226, and may be loaded into at least one of one or more memories, such as main memory 208, for execution by processing unit 206. The processes of the illustrative embodiments may be performed by processing unit 206 using computer implemented instructions, which may be located in a memory, such as, for example, main memory 208, read only memory 224, or in one or more peripheral devices.

Furthermore, in one case, code 226A may be downloaded over network 201A from remote system 201B, where similar code 201C is stored on a storage device 201D. in another case, code 226A may be downloaded over network 201A to remote system 201B, where downloaded code 201C is stored on a storage device 201D.

The hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. In addition, the processes of the illustrative embodiments may be applied to a multiprocessor data processing system.

In some illustrative examples, data processing system 200 may be a personal digital assistant (PDA), which is generally configured with flash memory to provide non-volatile memory for storing operating system files and/or user-generated data. A bus system may comprise one or more buses, such as a system bus, an I/O bus, and a PCI bus. Of course, the bus system may be implemented using any type of communications fabric or architecture that provides for a transfer of data between different components or devices attached to the fabric or architecture.

A communications unit may include one or more devices used to transmit and receive data, such as a modem or a network adapter. A memory may be, for example, main memory 208 or a cache, such as the cache found in North Bridge and memory controller hub 202. A processing unit may include one or more processors or CPUs.

The depicted examples in FIGS. 1-2 and above-described examples are not meant to imply architectural limitations. For example, data processing system 200 also may be a tablet computer, laptop computer, or telephone device in addition to taking the form of a mobile or wearable device.

Where a computer or data processing system is described as a virtual machine, a virtual device, or a virtual component, the virtual machine, virtual device, or the virtual component operates in the manner of data processing system 200 using virtualized manifestation of some or all components depicted in data processing system 200. For example, in a virtual machine, virtual device, or virtual component, processing unit 206 is manifested as a virtualized instance of all or some number of hardware processing units 206 available in a host data processing system, main memory 208 is manifested as a virtualized instance of all or some portion of main memory 208 that may be available in the host data processing system, and disk 226 is manifested as a virtualized instance of all or some portion of disk 226 that may be available in the host data processing system. The host data processing system in such cases is represented by data processing system 200.

With reference to FIGS. 3-15, these figures depict an example process for fabricating nanosheet transistors in accordance with one or more illustrative embodiments. In the particular embodiments illustrated in FIGS. 3-15, a two NFET structures and two PFET structures are fabricated upon a substrate and/or wafer. It should be understood that in other embodiments, any combination of NFETs and PFETs or other combinations of any numbers of nanosheet semiconductor devices, may be fabricated on a substrate in a similar manner.

Figure 3:
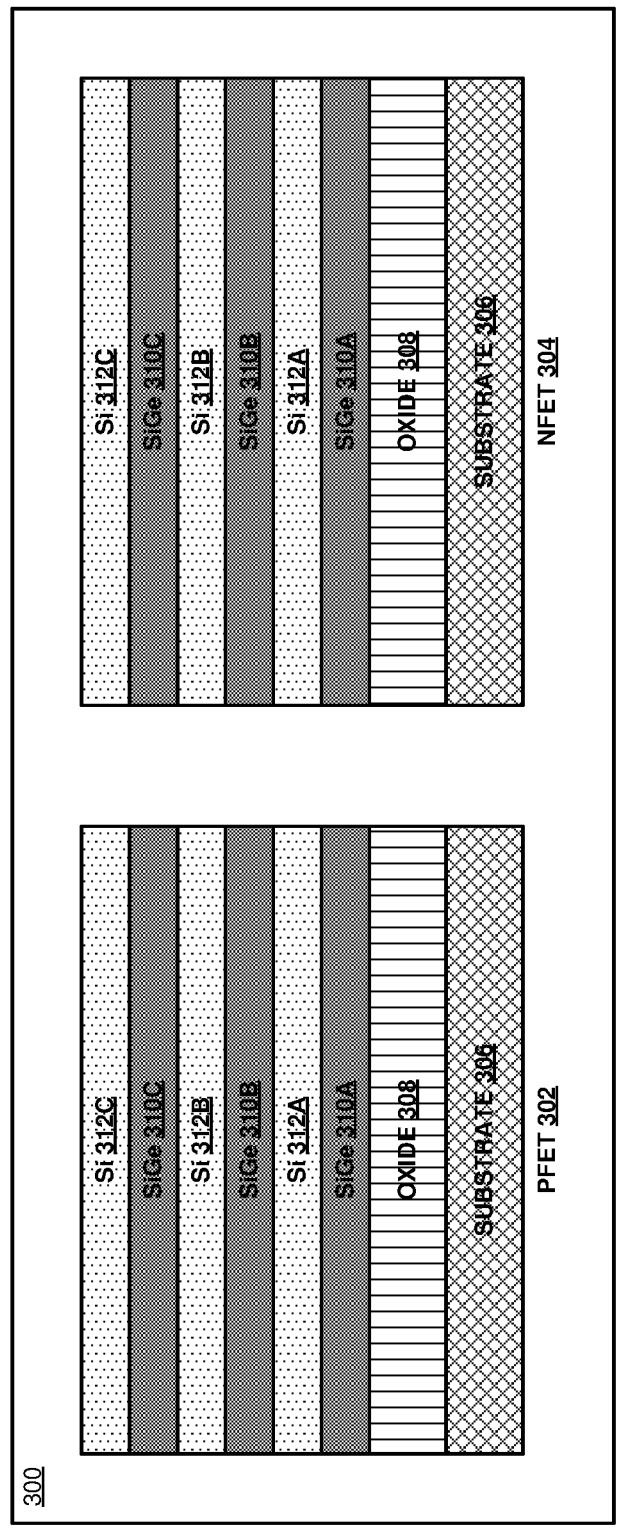
FIG. 3 depicts a portion of a process according to an illustrative embodiment.

With reference to FIG. 3, this figure depicts a portion of a process in which an example substrate structure 300 is received according to an illustrative embodiment. Substrate structure 300 includes a PFET region 302 and an NFET region 304 in accordance with an illustrative embodiment. In one or more embodiments, PFET region 302 and NFET region 304 are each nanosheet transistors. Application 105 in FIG. 1 interacts with fabrication system 107 to produce or manipulate substrate structure 300 as described herein.

Each of PFET region 302 and NFET region 304 includes a substrate layer 306, an oxide layer (or another type of dielectric isolation layer) 308 formed on substrate layer 306, a first silicon-germanium (SiGe) layer 310a formed on oxide layer 308, a first silicon (Si) layer 312a formed on first SiGe layer 310a, a second SiGe layer 310b formed on first Si layer 312a, a second Si layer 312b formed on second SiGe layer 310b, a third SiGe layer 310c formed on second Si layer 312b, and a third Si layer 312c formed on third SiGe layer 310c. In one or more embodiments, substrate 310 is formed of a silicon (Si) material. SiGe layers 310a-310c function as sacrificial layers that are substantially removed during subsequent portions of the process. Si layers 312a-312c function as nanosheet layers of the nanosheet transistors.

Figure 4:
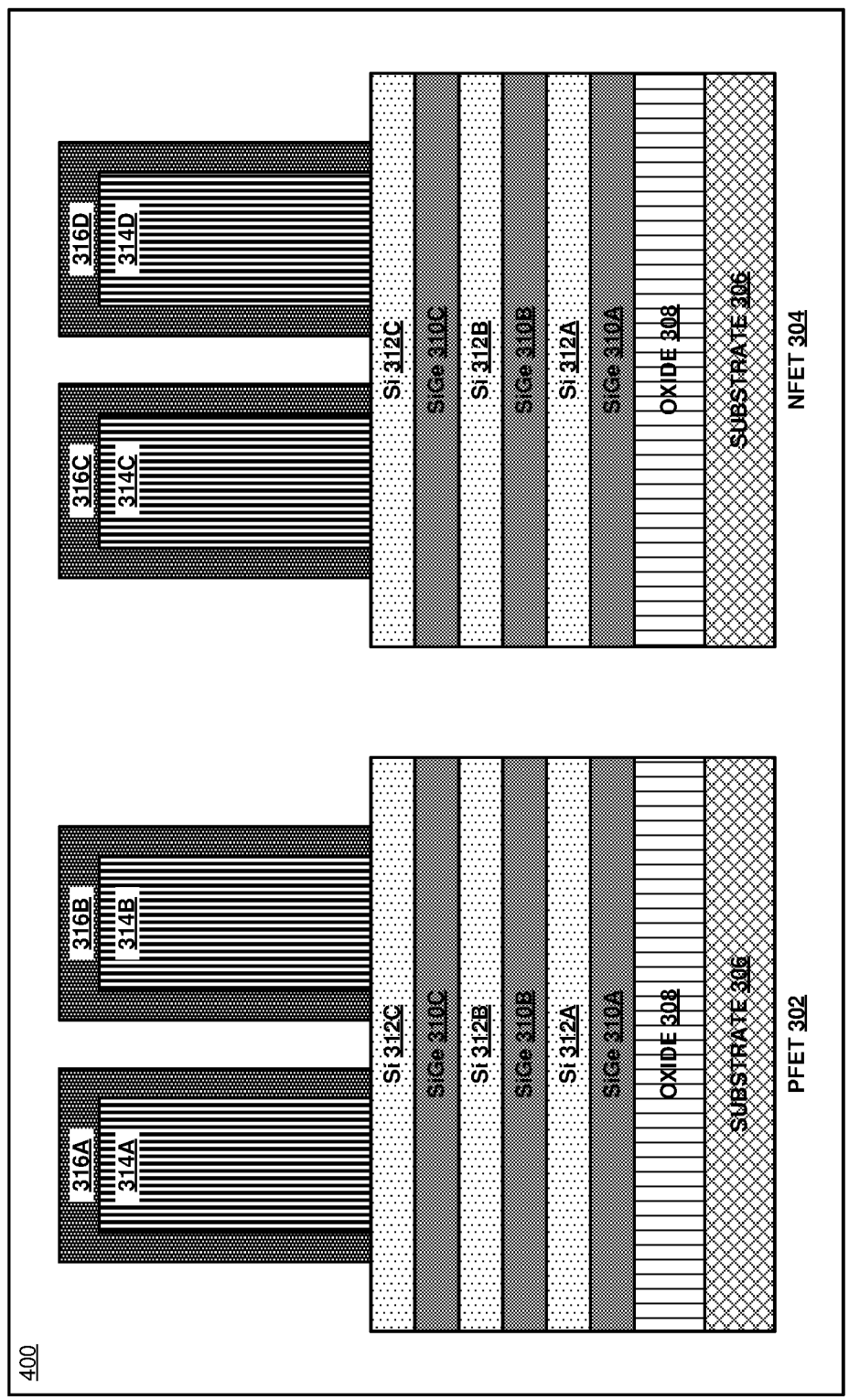
FIG. 4 depicts another portion of a process according to an illustrative embodiment.

With reference to FIG. 4, FIG. 4 depicts another portion of a process in which a structure 400 is formed according to an embodiment. In one or more embodiments, fabrication system 107 forms a first dummy gate 314a and a second dummy gate 314a upon third Si layer 312c of PFET region 302, and a third dummy gate 314b and a fourth dummy gate 314c upon third Si layer 312c of NFET region 304. In the illustrated embodiment, first dummy gate 314a, second dummy gate 314b, third dummy gate 314c, and fourth dummy gate 314d extend vertically from the upper surface of third Si layer 312c. In one or more embodiments, first dummy gate 314a, second dummy gate 314b, third dummy gate 314c, and fourth dummy gate 314d function as spacers that are removed and replaced with metal material to form gates during subsequent portions of the fabrication process as further described herein. In particular embodiments, first dummy gate 314a, second dummy gate 314b, third dummy gate 314c, and fourth dummy gate 314d are formed of a silicon nitride (SiN) material. In one or more embodiments, first dummy gate 314a, second dummy gate 314b, third dummy gate 314c, and fourth dummy gate 314d are formed by one or more deposition processes.

In one or more embodiments, fabrication system 107 further forms a first hard mask 316a over first dummy gate 314a, a second hard mask 316b over second dummy gate 314b, a third hard mask 316c over third dummy gate 314c, and a fourth hard mask 314d over fourth dummy gate 314d. First hard mask 316a, second hard mask 316b, third hard mask 316c, and fourth hard mask 316d function as a protective layer over first dummy gate 314a, second dummy gate 314b, third dummy gate 314c, and fourth dummy gate 314d, respectively. In a particular embodiment, first hard mask 316a, second hard mask 316b, third hard mask 316c, and fourth hard mask 316d are formed of a siliconborocarbonitride (SiBCN) material.

Figure 5:
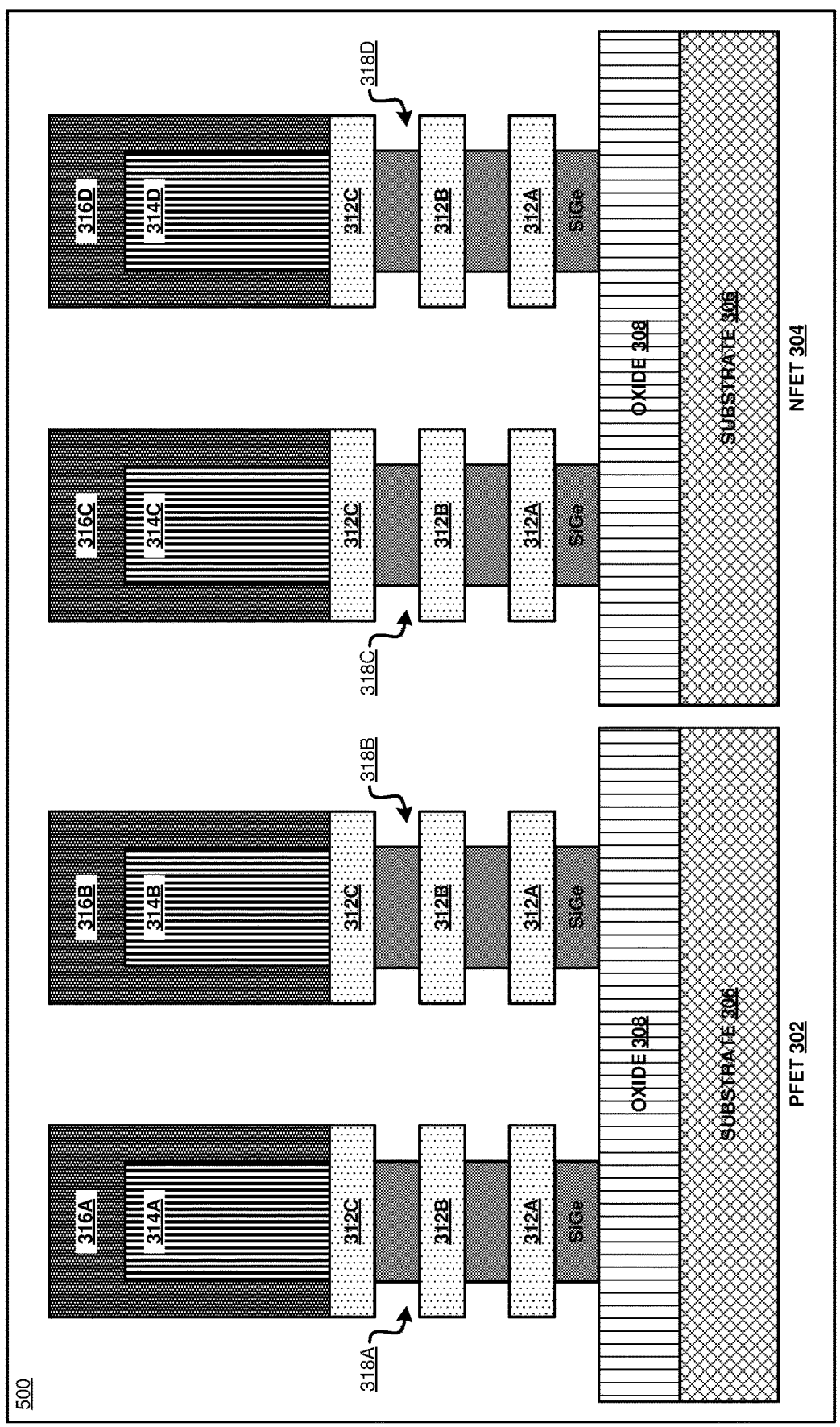
FIG. 5 depicts another portion of a process according to an illustrative embodiment.

With reference to FIG. 5, FIG. 5 depicts another portion of a process in which structure 500 is formed according to an embodiment. In one or more embodiments, fabrication system 107 etches through portions of first SiGe layer 310a, first Si layer 312a, second SiGe layer 310b, second Si layer 312b, third SiGe layer 310c, and third Si layer in NFET region 302 to be substantially aligned to sides of first hard mask 316a and second hard mask 316b. In the embodiment, fabrication system 107 etches through portions of first SiGe layer 310a, first Si layer 312a, second SiGe layer 310b, second Si layer 312b, third SiGe layer 310c, and third Si layer in NFET region 304 to be substantially aligned to sides of third hard mask 316c and fourth hard mask 316b. In the embodiment, fabrication system 107 selectively laterally etches edges of each of first SiGe layer 310a, second SiGe layer 310b, and third SiGe layer 310c of PFET region 302 and NFET region 304 to create divots (or indentations) 318a-318d within SiGe layers 310a-310c without substantially affecting Si layers 312a-312c. In one or more embodiments, the depth of divots 318a-318d within SiGe layers 310a-310c are substantially aligned with the sides of dummy gates 314a-314d, respectively. In particular embodiments, divots 318 are created using a vapor phase (e.g., HCl) or wet etching process.

Figure 6:
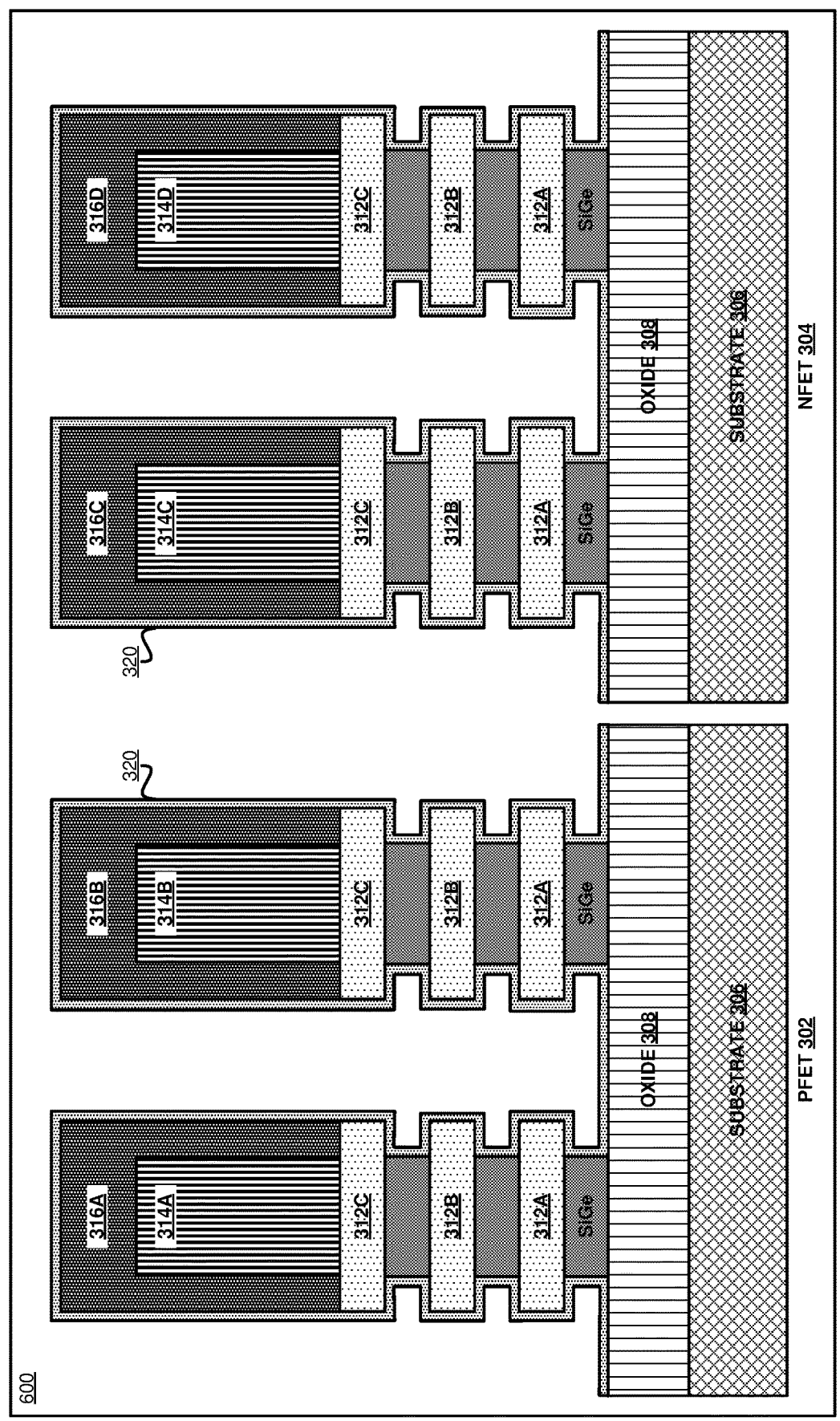
FIG. 6 depicts another portion of a process according to an illustrative embodiment.

With reference to FIG. 6, FIG. 6 depicts another portion of a process in which a structure 700 is formed according to an embodiment. In one or more embodiments, fabrication system 107 deposits a first liner 320 upon the upper surface of oxide layer 308, first SiGe layer 310a, first Si layer 312a, second SiGe layer 310b, second Si layer 312b, third SiGe layer 310c, third Si layer 312c, first hard mask 316a, second hard mask 316b, third hard mask 316c, and fourth hard mask 316d of PFET region 302 and NFET region 304. In a particular embodiment, first liner 320 is formed of an aluminum oxide ($Al_2O_3$) material.

Figure 7:
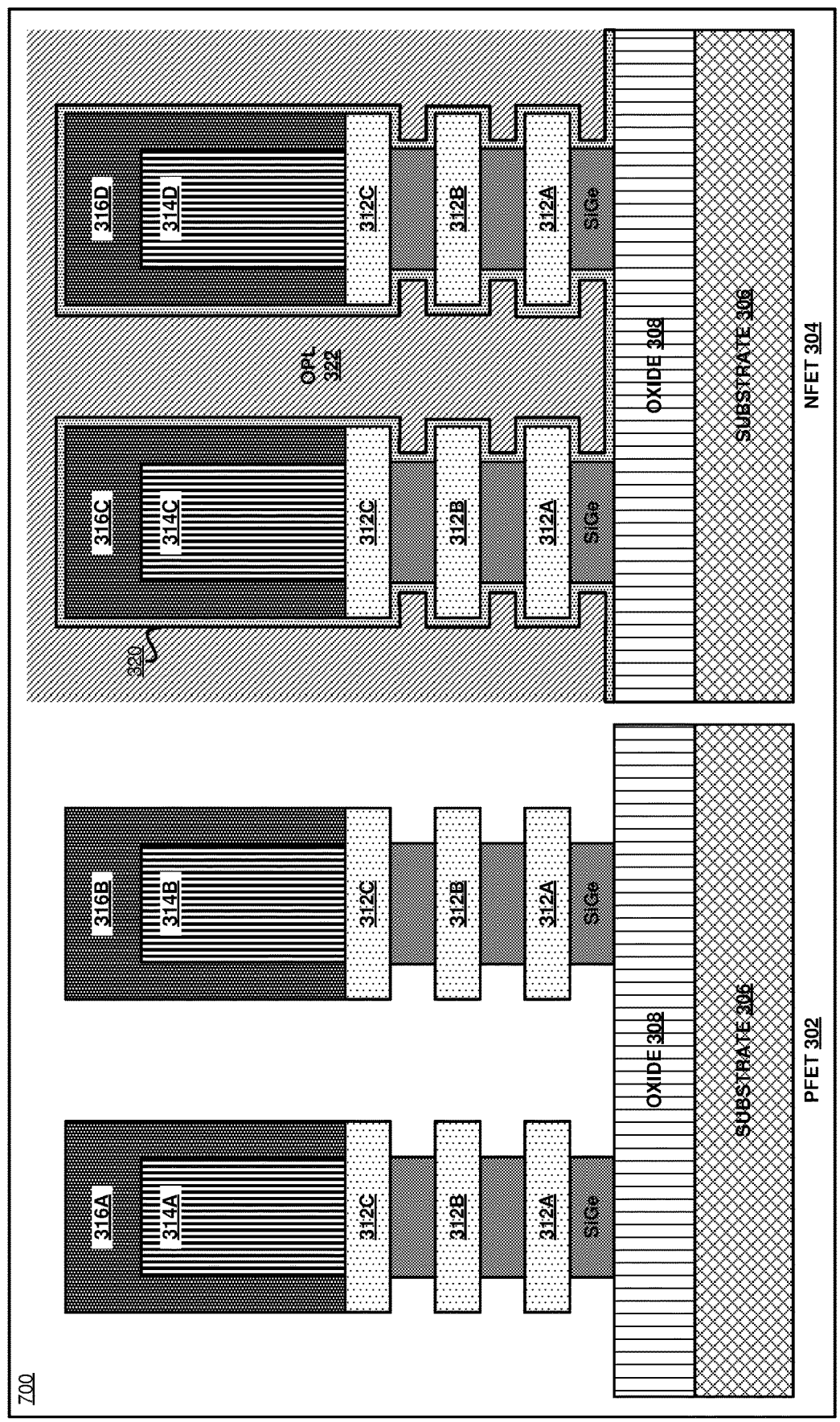
FIG. 7 depicts another portion of a process according to an illustrative embodiment.

With reference to FIG. 7, FIG. 7 depicts another portion of a process in which a structure 700 is formed according to an embodiment. In one or more embodiments, fabrication system 107 applies a mask 322 to mask NFET region 304. In a particular embodiment, mask 322 is an organic planarizing layer (OPL). In one or more embodiments, fabrication system 107 removes first liner 320 from PFET region 302. In a particular embodiment, fabrication system 107 removes first liner 320 from PFET region 302 using a wet etching process. The portion of first liner 320 within NFET region 304 is protected from removal by mask 322. In the embodiment, mask 322 is then stripped from NFET region 304.

Figure 8:
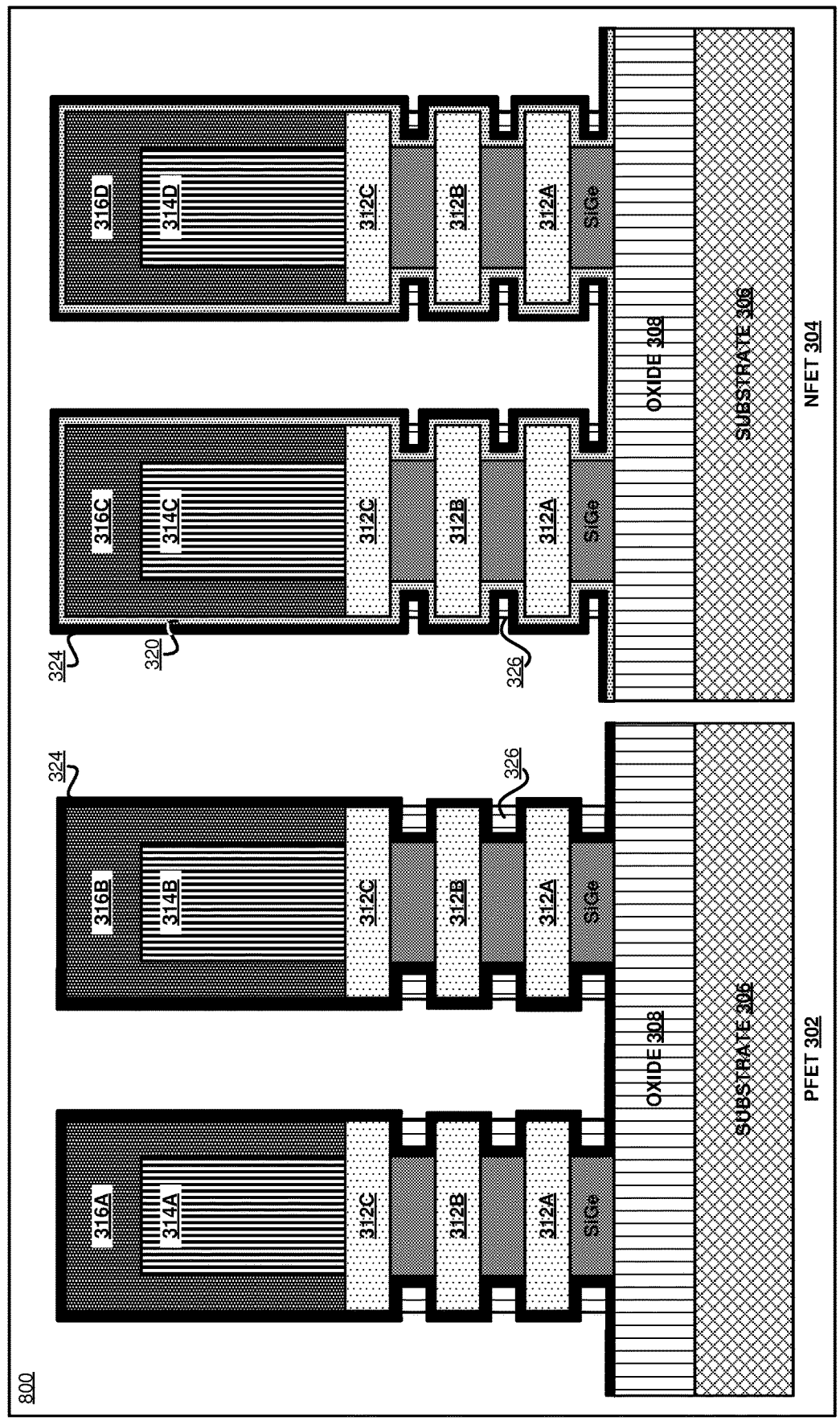
FIG. 8 depicts another portion of a process according to an illustrative embodiment.

With reference to FIG. 8, FIG. 8 depicts another portion of a process in which a structure 800 is formed according to an embodiment. In one or more embodiments, fabrication system 107 deposits a second liner 324 upon the upper surface of oxide layer 308, first SiGe layer 310a, first Si layer 312a, second SiGe layer 310b, second Si layer 312b, third SiGe layer 310c, third Si layer 312c, first hard mask 316a, and second hard mask 316b of PFET region 302. In the embodiment, fabrication system 107 further deposits second liner 324 upon first liner 320 of NFET region 304. In a particular embodiment, second liner 324 is formed of an SiN material. In the embodiment, fabrication system 107 further fills divots 318 of PFET region 302 and NFET region 304 with an oxide fill 326 such that the oxide 326 is deposited upon the portions of second liner 324 within divots 318.

Figure 9:
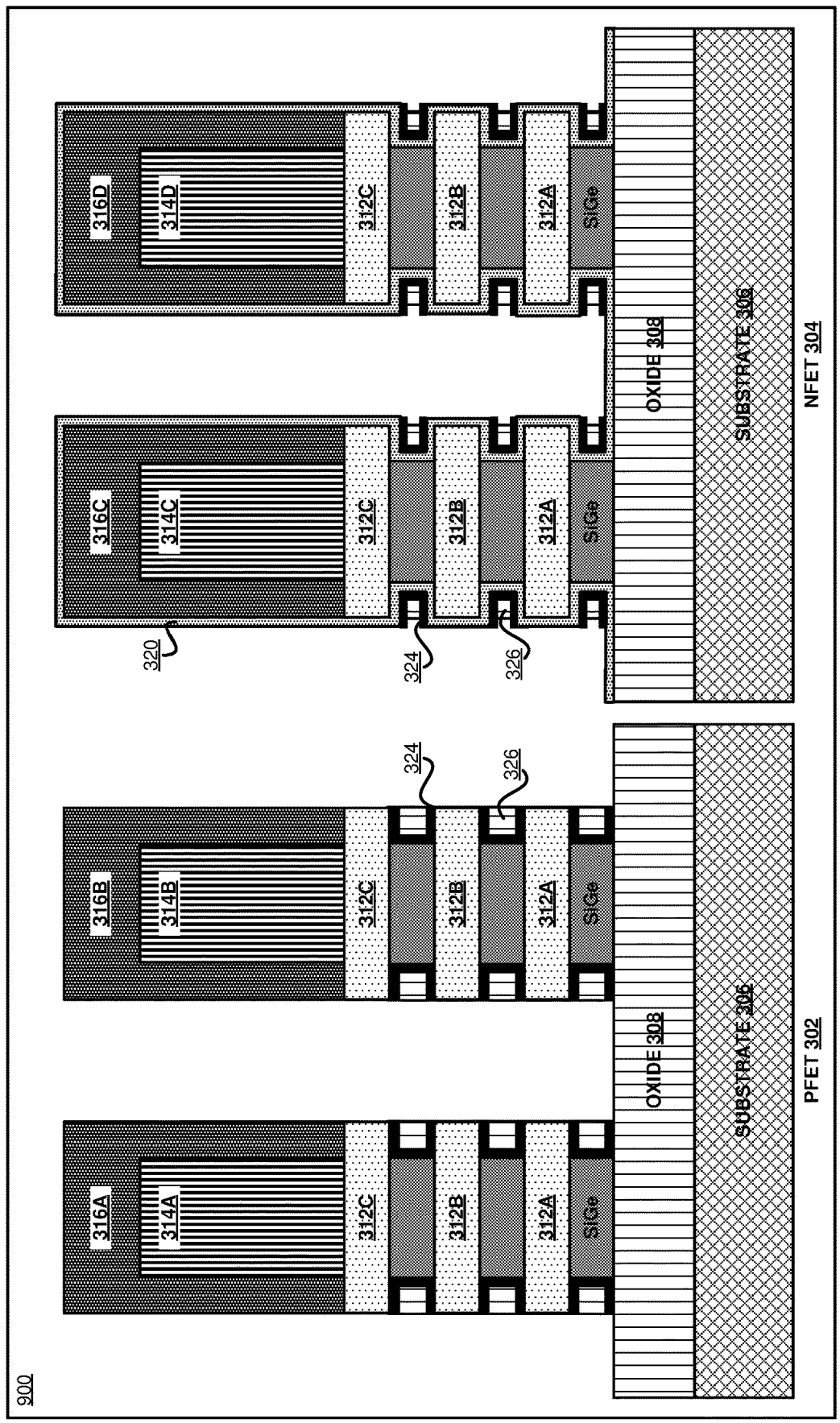
FIG. 9 depicts another portion of a process according to an illustrative embodiment.

With reference to FIG. 9, FIG. 9 depicts another portion of a process in which a structure 900 is formed according to an embodiment. In one or more embodiments, fabrication system 107 selectively removes second liner 324 from portions of PFET region 302 and NFET region 304 such that portions of second liner not within divots 318 are substantially removed and portions of second liner 324 within divots 318 substantially remain. In a particular embodiment, fabrication system 107 selectively removes second liner 324 using a removal process that is selective to SiN material but does not remove SiBCN or $Al_2O_3$ material.

Figure 10:
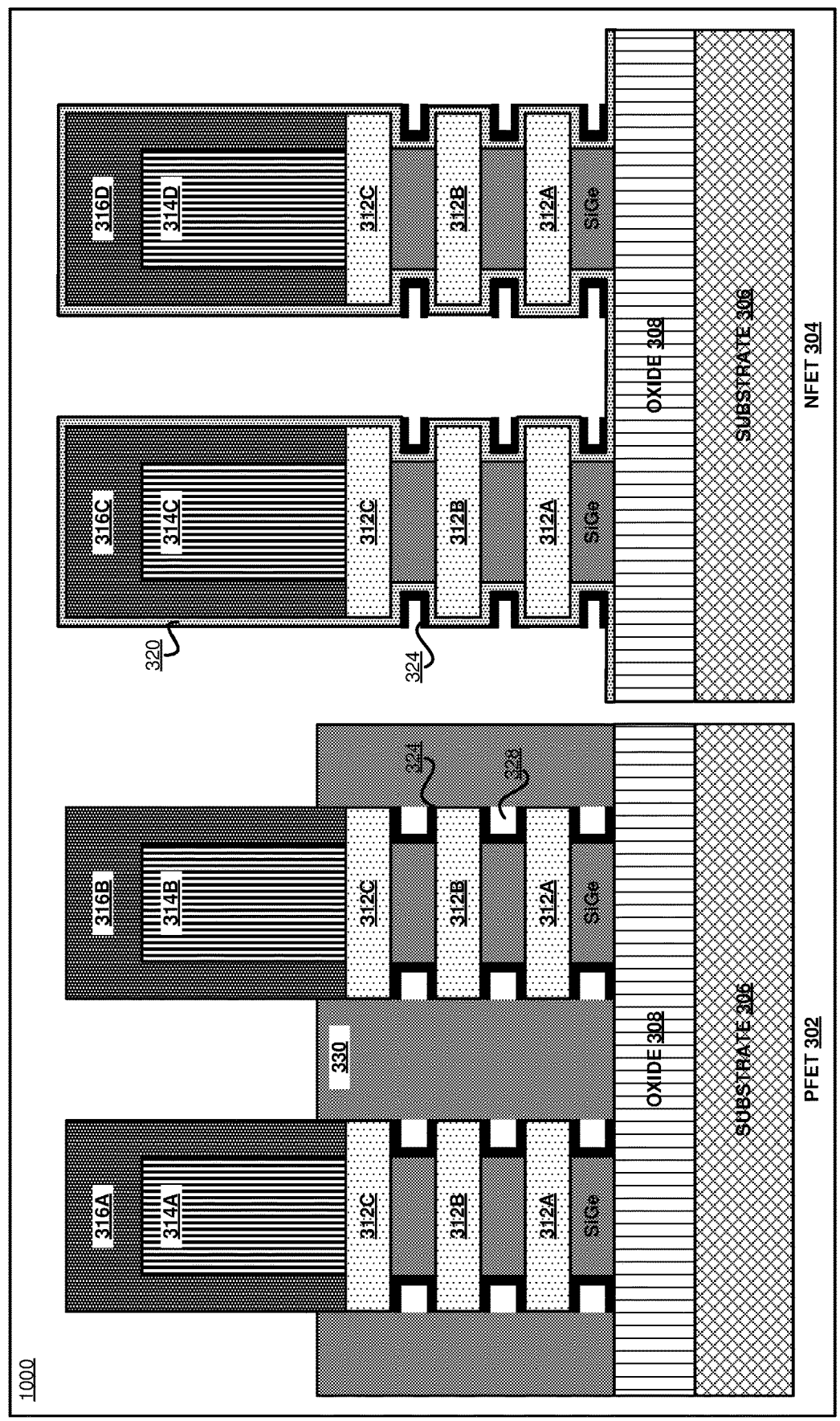
FIG. 10 depicts another portion of a process according to an illustrative embodiment.

With reference to FIG. 10, FIG. 10 depicts another portion of a process in which a structure 1000 is formed according to an embodiment. In one or more embodiments, fabrication system 107 removes oxide fill 326 from divots 318 and deposits a PFET epitaxy 330 in PFET region 302 to form PFET air gap spacers 328 of divots 318 in PFET region 302. In a particular embodiment, PFET epitaxy 330 is formed of a p-type epitaxy material. In one or more embodiments, second liner 324 of PFET air gap spacers 328 are formed of a material having a negative charge to reduce extension resistance and/or parasitic capacitance of PFET region 302.

Figure 11:
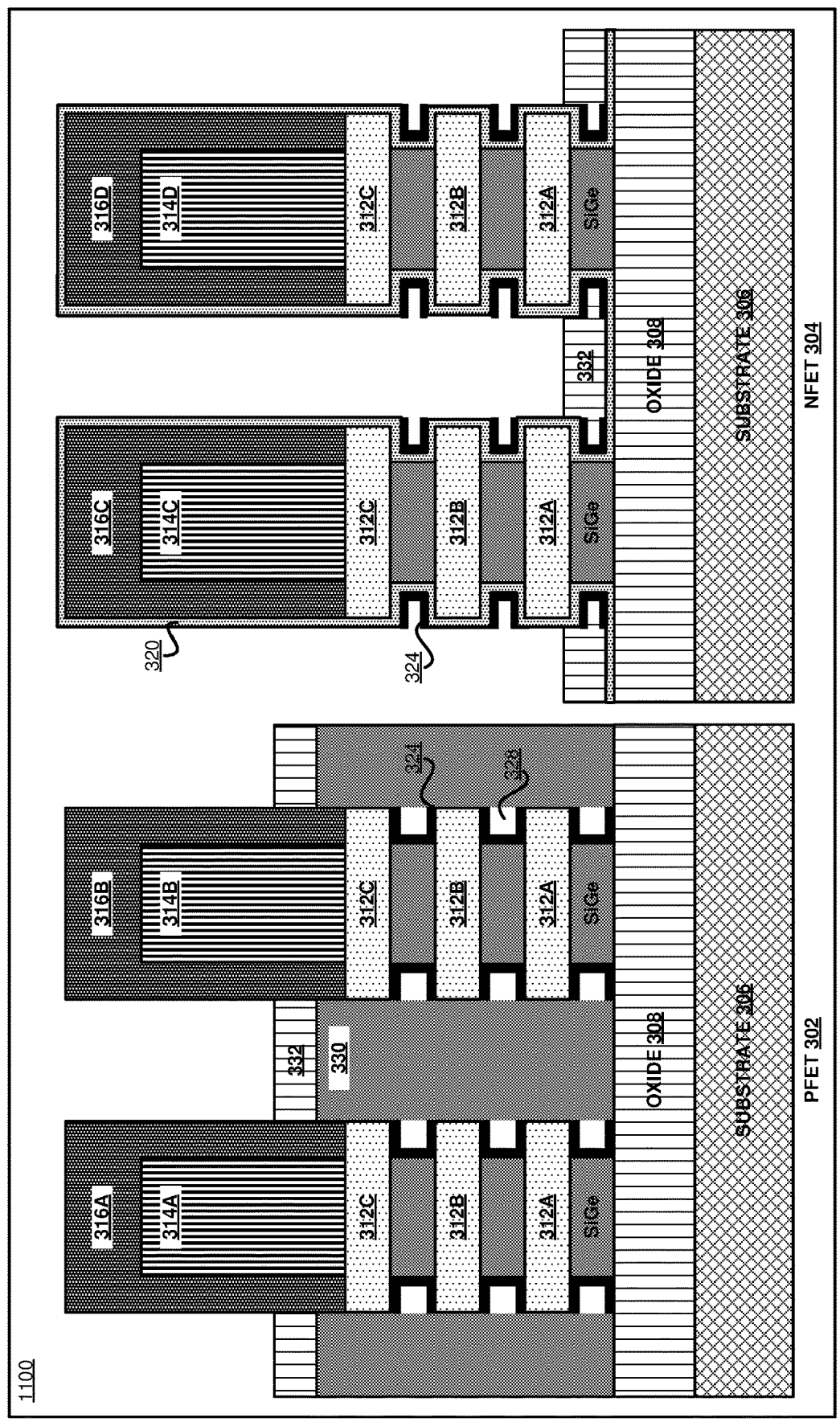
FIG. 11 depicts another portion of a process according to an illustrative embodiment.

With reference to FIG. 11, FIG. 11 depicts another portion of a process in which a structure 1100 is formed according to an embodiment. In one or more embodiments, fabrication system 107 directionally deposits a second oxide layer 332 on PFET epitaxy 330 of PFET region 302, and the portion of first liner 320 deposited upon oxide layer 308 of NFET region 304. In a particular embodiment, the second oxide layer 332 is formed of a silicon dioxide ($SiO_2$) material. In a particular embodiment, fabrication system 107 deposits second oxide layer 332 using a gas cluster ion beam (GCIB) or high-density plasma (HDP) deposition process.

Figure 12:
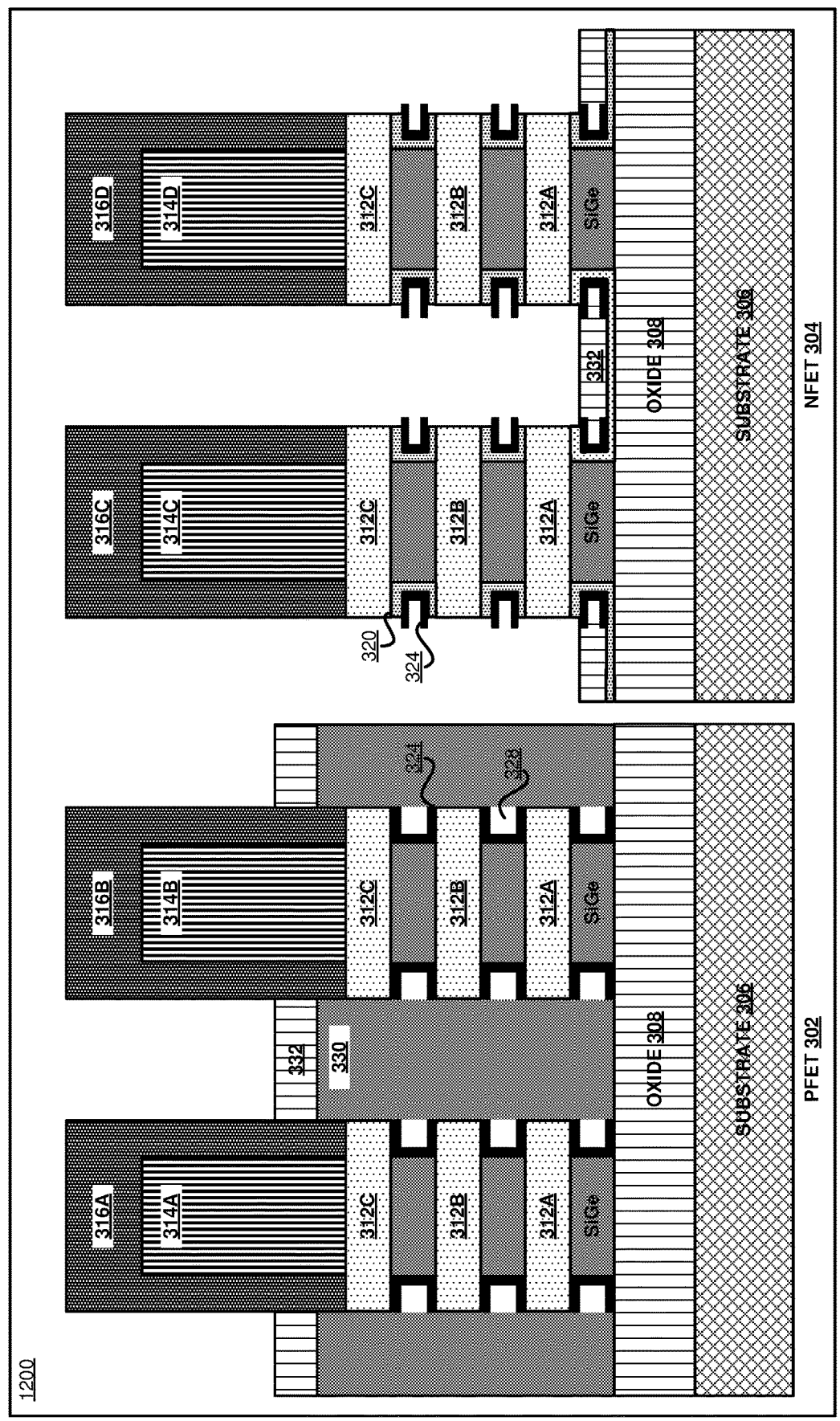
FIG. 12 depicts another portion of a process according to an illustrative embodiment.

With reference to FIG. 12, FIG. 12 depicts another portion of a process in which a structure 1200 is formed according to an embodiment. In one or more embodiments, fabrication system 107 selectively removes second oxide layer 322 to pull down second oxide layer 322. In the embodiment, fabrication system 107 further selectively removes first liner 320 from NFET region 304 to substantially remove first liner 320 from NFET region 302 except for portions of first liner 320 within divots 318 of NFET region 302.

Figure 13:
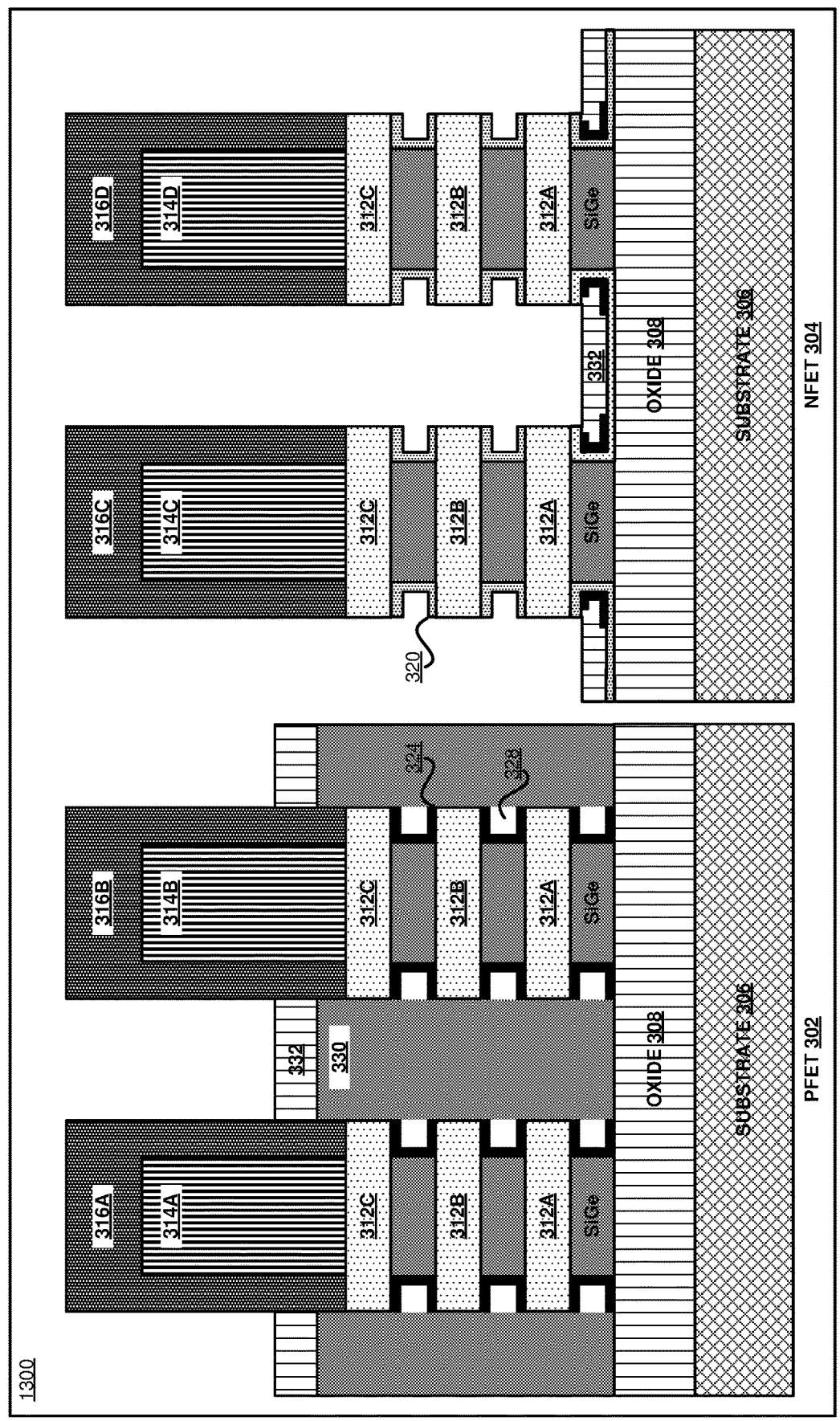
FIG. 13 depicts an optional portion of a process according to an illustrative embodiment.

With reference to FIG. 13, FIG. 13 depicts an optional portion of a process in which a structure 1300 is formed according to an embodiment. In one or more embodiments, fabrication system 107 selectively removes second liner 324 from divots 318 of NFET region 304.

Figure 14:
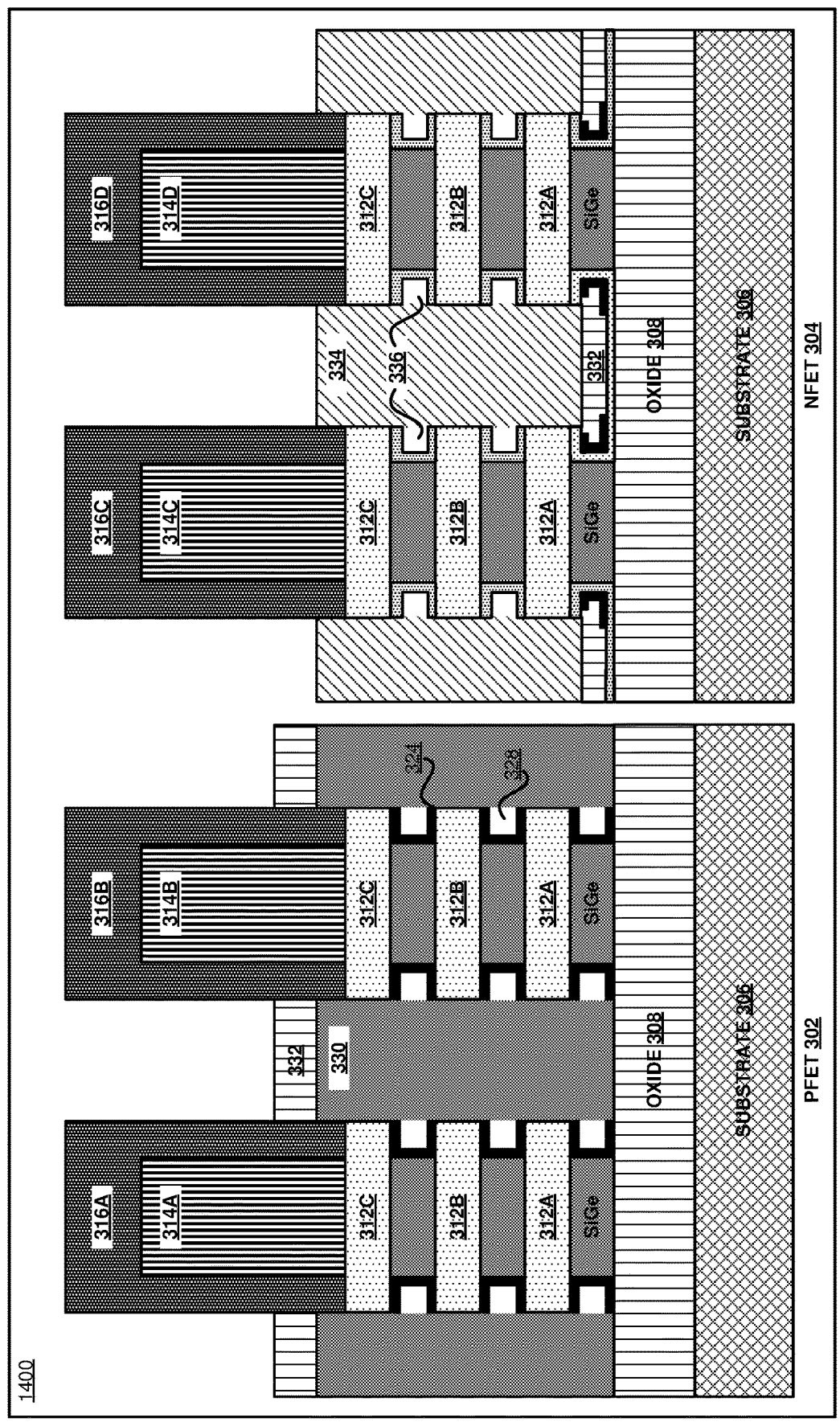
FIG. 14 depicts another portion of a process according to an illustrative embodiment.

With reference to FIG. 14, FIG. 14 depicts another portion of a process in which a structure 1400 is formed according to an embodiment. In one or more embodiments, fabrication system 107 deposits an NFET epitaxy 334 in NFET region 304 to form NFET air gap spacers 336 of divots 318 in NFET region 304. In a particular embodiment, NFET epitaxy 334 is formed of an n-type epitaxy material. In one or more embodiments, first liner 320 of NFET air gap spacers 336 are formed of a material having a positive charge to reduce extension resistance and/or parasitic capacitance of NFET region 304.

Figure 15:
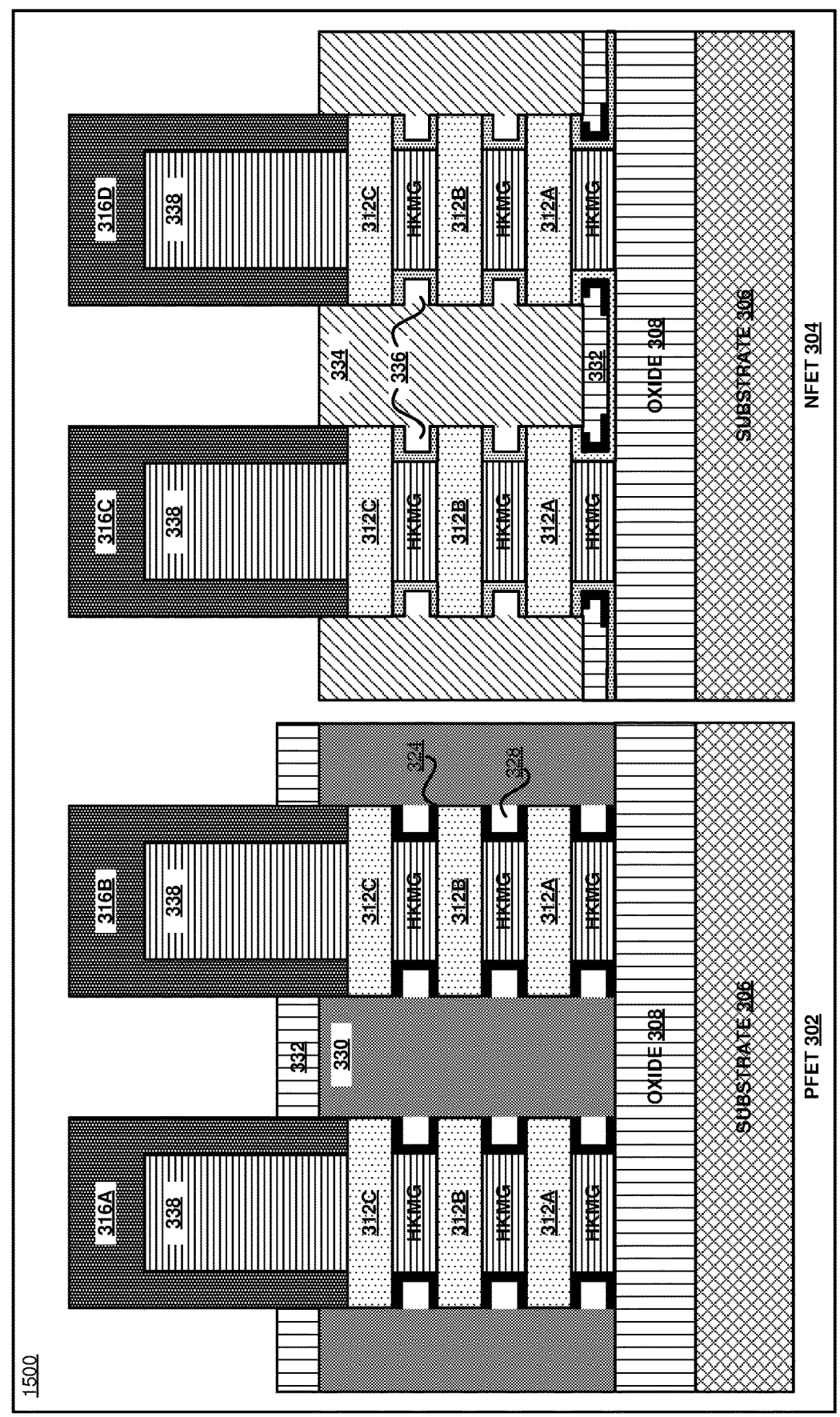
FIG. 15 depicts another portion of a process according to an illustrative embodiment.

With reference to FIG. 15, FIG. 15 depicts another portion of a process in which a structure 1500 is formed according to an embodiment. In one or more embodiments, fabrication system 107 removes dummy gates 314a-314d, removes sacrificial layers 312a-312c, and deposits a high-K metallic gate (HKMG) material 338 or other work function metal (WFM) within the voids left by the removal in each of PFET region 302 and NFET region 304 to form gates for PFET region 302 and NFET region 304, respectively. In one or more embodiments, fabrication system 107 further forms a self-aligned contact (SAC) cap upon the HKMG material 332 of PFET region 302 and NFET region 304. In particular embodiments, fabrication system 107 further forms contacts to the S/D region and gates of each of PFET region 302 and NFET region 304. As a result, PFETs are fabricated within PFET region 302 and NFETs are fabricated within NFET region 304.

Figure 16:
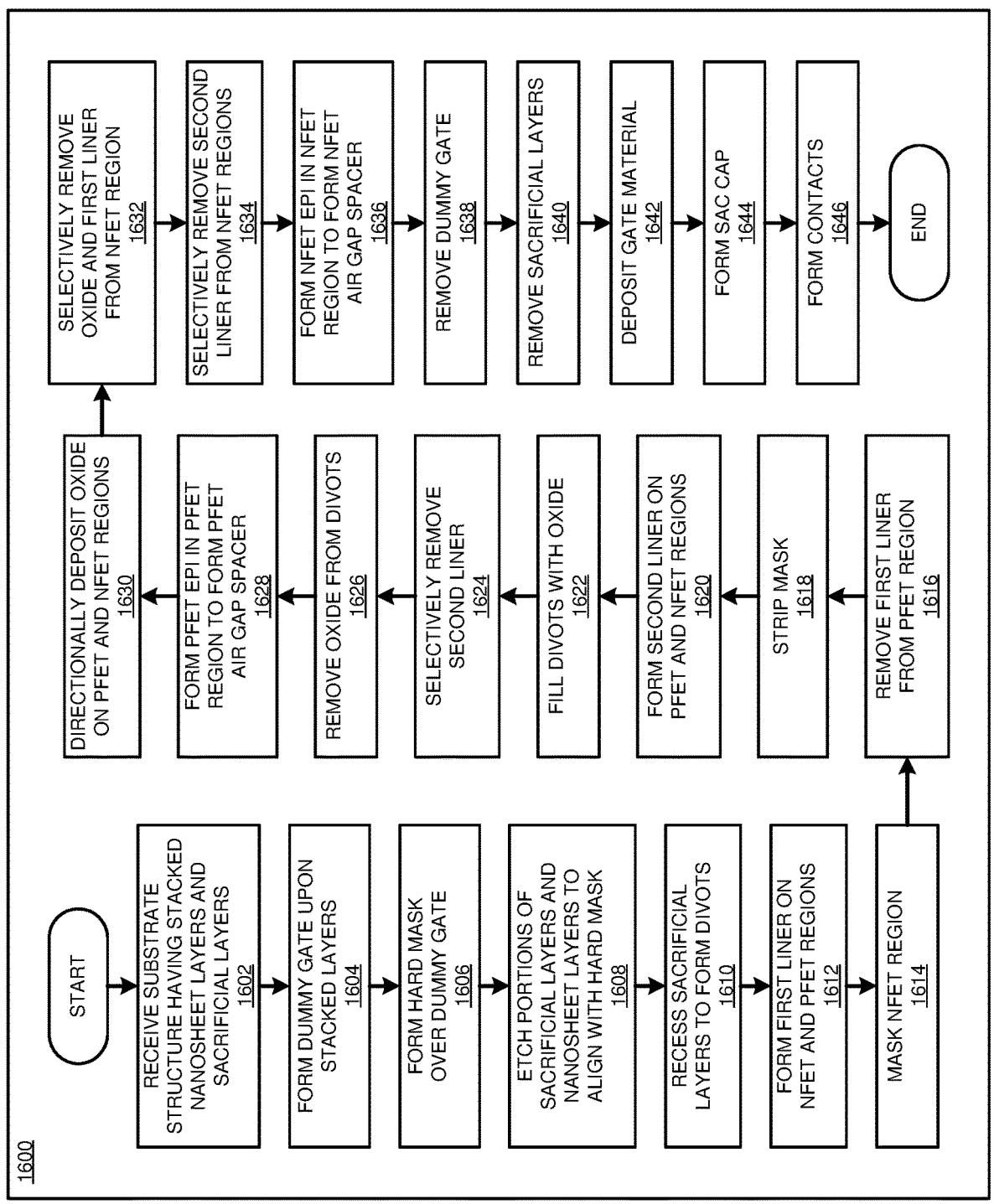
FIG. 16 depicts a flowchart of an example process for fabricating nanosheet transistors in accordance with an illustrative embodiment.

With reference to FIG. 16, FIG. 16 depicts a flowchart of an example process 1600 for fabricating nanosheet transistors in accordance with one or more illustrative embodiments. Process 1600 can be implemented in fabrication system 107 in FIG. 1, to perform one or more steps of FIGS. 3-15 as needed in process 1600.

In block 1602, fabrication system 107 receives a substrate structure having one or more nanosheet layers and one or more sacrificial layers stacked upon an isolation layer and a substrate. In a particular embodiment, the substrate structure includes substrate structure 300 having nanosheet layers formed of Si layers 312a-312c and sacrificial layers formed of SiGe layers 310a-310c. In a particular embodiment, the substrate structure includes a PFET region 302 and an NFET region 304.

In block 1604, fabrication system 107 forms one or more dummy gates upon each of PFET region 302 and NFET region 304 of the stacked nanosheet and sacrificial layers. In a particular embodiment, the dummy gate includes one or more of dummy gates 314a-314d. In one or more embodiments, the dummy gate functions as a spacer that is removed and replaced with metal material to form gates during subsequent portions of the fabrication process as further described herein. In block 1606, fabrication system 107 forms a hard mask, such as one or more of hard mask 316a-316d over each of the dummy gates. The hard mask functions as a protective layer over the dummy gate.

In block 1608, fabrication system 107 etches through portions of the sacrificial layers to substantially align to sides of the hard masks. In block 1610, fabrication system 107 selectively laterally etches edges of each of the sacrificial layers to form divots (or indentations) within the sacrificial layers without substantially affecting the nanosheet layers. In one or more embodiments, the depth of the divots within the sacrificial layers are substantially aligned with the sides of the dummy gates.

In block 1612, fabrication system 107 forms a first liner 320 upon the upper surface of oxide layer 308, the sacrificial layers, the nanosheet layers, and the hard masks of PFET region 302 and NFET region 304. In block 1614, fabrication system 107 applies a mask 322 to mask NFET region 304. In a particular embodiment, mask 322 is an organic planarizing layer (OPL). In block 1616, fabrication system 107 removes first liner 320 from PFET region 302. In a particular embodiment, fabrication system 107 removes first liner 320 from PFET region 302 using a wet etching process. The portion of first liner 320 within NFET region 304 is protected from removal by mask 322. In block 1618, fabrication system 107 strips mask 322 from NFET region 304.

In block 1620, fabrication system 107 deposits a second liner 324 upon the upper surface of oxide layer 308, the sacrificial layers, the nanosheet layers, and the hard masks of PFET region 302. In the embodiment, fabrication system 107 further deposits second liner 324 upon first liner 320 of NFET region 304. In a particular embodiment, second liner 324 is formed of an SiN material. In block 1622, fabrication system 107 further fills divots 318 of PFET region 302 and NFET region 304 with an oxide fill 326 such that the oxide 326 is deposited upon the portions of second liner 324 within divots 318.

In block 1624, fabrication system 107 selectively removes second liner 324 from portions of PFET region 302 and NFET region 304 such that portions of second liner not within divots 318 are substantially removed and portions of second liner 324 within divots 318 substantially remain. In block 1626, fabrication system 107 removes oxide fill 326 from divots 318. In block 1628, fabrication system 107 deposits a PFET epitaxy 330 in PFET region 302 to form PFET air gap spacers 328 of divots 318 in PFET region 302. In a particular embodiment, PFET epitaxy 330 is formed of a p-type epitaxy material. In one or more embodiments, second liner 324 of PFET air gap spacers 328 are formed of a material having a negative charge to reduce extension resistance and/or parasitic capacitance of PFET region 302.

In block 1630, fabrication system 107 directionally deposits a second oxide layer 332 on PFET epitaxy 330 of PFET region 302, and the portion of first liner 320 deposited upon oxide layer 308 of NFET region 304. In a particular embodiment, the second oxide layer 332 is formed of a silicon dioxide (SiO$_2$) material. In block 1632, fabrication system 107 selectively removes second oxide layer 322 to pull down second oxide layer 322. In the embodiment, fabrication system 107 further selectively removes first liner 320 from NFET region 304 to substantially remove first liner 320 from NFET region 302 except for portions of first liner 320 within divots 318 of NFET region 302.

In block 1634, fabrication system 107 selectively removes second liner 324 from divots 318 of NFET region 304. In block 1636, fabrication system 107 forms an NFET epitaxy 334 in NFET region 304 to form NFET air gap spacers 336 of divots 318 in NFET region 304. In a particular embodiment, NFET epitaxy 334 is formed of an n-type epitaxy material. In one or more embodiments, first liner 320 of NFET air gap spacers 336 are formed of a material having a positive charge to reduce extension resistance and/or parasitic capacitance of NFET region 304.

In block 1638, fabrication system 107 removes the dummy gates. In block 1640, fabrication system 107 removes the sacrificial layers. In block 1642, fabrication system 107 deposits a high-K metallic gate (HKMG) material 338 or other work function metal (WFM) within the voids left by the removal in each of PFET region 302 and NFET region 304 to form gates for PFET region 302 and NFET region 304, respectively. In block 1644, fabrication system 107 further forms a self-aligned contact (SAC) cap upon the HKMG material 332 of PFET region 302 and NFET region 304. In block 1646, fabrication system 107 further forms contacts to the S/D region and gates of each of PFET region 302 and NFET region 304. As a result, PFETs are fabricated within PFET region 302 and NFETs are fabricated within NFET region 304. Fabrication system 107 ends process 1600 thereafter.

Thus, a computer implemented method, system or apparatus, and computer program product are provided in the illustrative embodiments for fabricating nanosheet transistors in accordance with one or more illustrative embodiments and other related features, functions, or operations. Where an embodiment or a portion thereof is described with respect to a type of device, the computer implemented method, system or apparatus, the computer program product, or a portion thereof, are adapted or configured for use with a suitable and comparable manifestation of that type of device.

Where an embodiment is described as implemented in an application, the delivery of the application in a Software as a Service (SaaS) model is contemplated within the scope of the illustrative embodiments. In a SaaS model, the capability of the application implementing an embodiment is provided to a user by executing the application in a cloud infrastructure. The user can access the application using a variety of client devices through a thin client interface such as a web browser (e.g., web-based e-mail), or other light-weight client-applications. The user does not manage or control the underlying cloud infrastructure including the network, servers, operating systems, or the storage of the cloud infrastructure. In some cases, the user may not even manage or control the capabilities of the SaaS application. In some other cases, the SaaS implementation of the application may permit a possible exception of limited user-specific application configuration settings.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. An apparatus comprising:
   a substrate structure having a set of nanosheet layers stacked upon a substrate, the substrate structure including a p-channel region and an n-channel region, the substrate structure further including divots within the p-channel region and the n-channel region;
   a first liner formed within the divots of the n-channel region, the first liner being formed of a material having a positive charge;
   a second liner formed within the divots of the p-channel region, the second liner being formed of a material having a negative charge;
   a p-type epitaxy deposited in the p-channel region to form first air gap spacers of the divots in the p-channel region; and
   an n-type epitaxy deposited in the n-channel region to form second air gap spacers of the divots in the n-channel region.

2. The apparatus of claim 1, further comprising:
   an isolation layer disposed upon the substrate, wherein the set of nanosheet layers are stacked upon the isolation layer.

3. The apparatus of claim 1, further comprising:
   a first gate material adjacent to the first air gap spacers of p-channel region; and
   a second gate material adjacent to the second air gap spacers of the n-channel region.

4. The apparatus of claim 3, further comprising:
   at least one metal contact in contact with the first gate material.

5. The apparatus of claim 1, wherein the set of nanosheet layers are formed of silicon (Si) material.

* * * * *